United States Patent [19]

Heaney, III

[11] Patent Number: 5,262,235
[45] Date of Patent: Nov. 16, 1993

[54] COATED CERAMIC FIBER SYSTEM

[75] Inventor: Joseph A. Heaney, III, Mason, Ohio

[73] Assignee: General Electric Company, Cincinnati, Ohio

[21] Appl. No.: 783,656

[22] Filed: Oct. 28, 1991

[51] Int. Cl.$^5$ ............................ B32B 9/00; D02G 3/00
[52] U.S. Cl. ................................... 428/373; 428/368; 428/375; 428/367; 428/378; 428/391; 427/249; 423/345
[58] Field of Search ............... 428/373, 344, 367, 368, 428/378, 391; 427/249; 423/345

[56] References Cited

U.S. PATENT DOCUMENTS

| | | | |
|---|---|---|---|
| 3,282,730 | 11/1966 | Johnston et al. | 117/212 |
| 3,811,920 | 5/1974 | Galasso et al. | 117/69 |
| 3,850,689 | 11/1974 | Basche et al. | 117/229 |
| 4,068,037 | 1/1978 | Debolt et al. | 428/368 |
| 4,237,184 | 12/1980 | Gonseth et al. | 428/336 |
| 4,315,968 | 2/1982 | Suplinskas et al. | 428/367 |
| 4,340,636 | 7/1982 | Debolt et al. | 428/215 |
| 4,373,006 | 2/1983 | Galasso et al. | 428/368 |
| 4,425,407 | 1/1984 | Galasso et al. | 428/368 |
| 4,442,169 | 4/1984 | Graham | 428/332 |
| 4,532,150 | 7/1985 | Endo et al. | 427/39 |
| 4,628,002 | 12/1986 | Suplinskas et al. | 428/367 |
| 4,724,169 | 2/1988 | Keem | 427/249 |
| 4,735,856 | 4/1988 | Schultz et al. | 428/366 |
| 4,898,778 | 2/1990 | Loszewski | 428/368 |
| 4,923,716 | 5/1990 | Brown et al. | 427/249 |

FOREIGN PATENT DOCUMENTS 3842420 6/1990 Fed. Rep. of Germany .

OTHER PUBLICATIONS

The Metallographic Structure of Continuous Vapor Deposited SiC Filaments; Appied Physics Letters, vol. 13, No. 1, 01 Jul. 1968.
Composition and Microstructure of CVD-C, SiC Coating on SiC Fiber; Journal of the Ceramic Society of Japan, International Edition; 99(1991) Nov., No. 11, Tokyo, JP.

Primary Examiner—Patrick J. Ryan
Assistant Examiner—Richard Weisberger
Attorney, Agent, or Firm—Jerome C. Squillaro; Carmen Santa Maria

[57] ABSTRACT

A ceramic fiber is provided with a plurality of coatings to define a system useful in making composite articles in the manufacture of which the fiber experiences applied stress such as thermal shock. For example, such applied stress occurs in molten metal spraying about fibers to provide a metal matrix composite. The fiber, as a core, is provided with a first coating layer tightly bonded to a lateral surface of the fiber and has a first structure. A second coating layer is then deposited on the first layer and has a second structure different from the first structure thereby defining an interface between the coating layers which is a debonding discontinuity zone sufficiently weak to enable reparation of the layers as a result of applied stress, such as introduced by a thermal shock experience.

6 Claims, No Drawings

COATED CERAMIC FIBER SYSTEM

This invention relates to coated ceramic fibers useful in making fiber reinforced composites and, more particularly, to coated single crystal fibers for use in reinforced metal matrix composites.

BACKGROUND OF THE INVENTION

Fiber reinforced composite structures and members are attractive to designers of power production apparatus such as gas turbine engines such composites can be made lightweight yet strong enough to perform in selected operating conditions. As used herein, the term "fiber" is intended to include filaments, fiber segments, strands, etc. For lower temperature conditions, various polymeric composites have been reported. For higher temperature operation, generally metal or ceramic matrix-reinforced composites are required for strong and tough behavior at such elevated temperatures above which polymers can decompose or degrade.

Attention has been given to carbonaceous fibers, such as of carbon or graphite, or to certain refractory fibers, such as tungsten coated with boron, as a reinforcing structure for composites. Such fibers have been coated with carbides, typically SiC, TiC and their combinations in various thicknesses. Typical of U.S. patents describing efforts along these lines include U.S. Pat. No. 3,811,920 (Galasso, et al.); U.S. Pat. No. 4,068,037 (DeBolt, et al.); U.S. Pat. No. 4,315,968 (Suplinskas, et al); U.S. Pat. No. 4,340,636 (DeBolt, et al.); and U.S. Pat. No. 4,898,778 (Loszewski). The disclosures of each of these patents are hereby incorporated herein by reference.

Reported work has manipulated such coatings as SiC in various thicknesses and elemental concentrations for the purpose of protecting the fiber from the environment during operation or adjusting its compatibility or wetability with a surrounding, encapsulating matrix. However, a special problem exists when a fiber is exposed to applied stress such as thermal shock during application of a matrix about the fiber during manufacture of a composite. For example, one fabrication method for advanced metal matrix composites uses the known low pressure plasma spraying of metallic matrices, for example of an alloy of titanium and aluminium, around the fibers. The thermal shock of the molten metal disposition and solidification about a fiber tends to damage it, causing breaks or large surface flaws in the fiber. This severely reduces strength of the fiber.

SUMMARY OF THE INVENTION

Briefly, in one form, the present invention provides a coated fiber and fiber system used in making a composite structure by a method in which the fiber experiences applied stress such as thermal shock during composite manufacture. The invention combines a ceramic fiber core, for example having an oriented structure, with a complex coating of particular grain structure and alignment. As used herein, the term "oriented structure" is intended to mean a single crystal or columnar grain structure. Bonded to a surface of the ceramic fiber is a first coating layer, for example, of a material which will react with the ceramic fiber of its surface to provide a reaction bonding phase between the ceramic fiber and the first layer. Grains of this first layer are predominantly columnar and are oriented angularly in relation to the fiber surface. Disposed on the first layer is a second coating layer of a structure different from and more granular than the structure of the first layer, to provide between the first and second layers a debonding interface. The difference in structure between the first and second layers defines a debonding discontinuity zone sufficiently weak to result in separation of the first and second coating layers at that zone as a result of thermal shock to the second layer, for example, as experienced in making a composite structure.

In the system of the present invention, the second coating layer acts as a sacrificial buffer. The first coating layer and the sacrifical second coating layer protect the underlying fiber from thermal shock damage. The fiber of the present invention enables manufacture of strong, high temperature, shock resistant composites, particularly composites having a metal matrix.

DESCRIPTION OF THE PREFERRED EMBODIMENTS

A preferred form of the present invention uses a ceramic fiber of alumina in single crystal form, generally known and marketed as sapphire fiber. Selection of such a fiber with a metal matrix enables manufacture of composite structures capable of withstanding strenuous exposure to elevated temperatures as are found in hot sections of gas turbines engines. As is well known in the composite area, fiber-reinforced metal matrix sheets or plies can be stacked and hot diffusion pressed into struts, vanes, etc. for use in the turbine section of such engines.

Evaluation of the present invention has included application of an adherent first coating layer of SiC to the surface of the single crystal structure of sapphire fiber. Under selected conditions of chemical vapor deposition (CVD), a deposited layer of SiC will react slightly with the sapphire fiber surface to generate a thin, adherent reaction portion of $SiO_2$. Such a reaction portion will facilitate bonding of the first layer of SiC to the fiber surface, so that the first layer of SiC can protect the underlying fiber during subsequent metal matrix composite manufacturing procedures. Conditions of SiC deposition also are selected to generate a Predominantly columnar crystal structure disposed angularly in respect to the surface of the single crystal fiber. It has been found that such SiC columnar layer generally grows normal to such surface.

Having provided such tightly, adherent, crystal structure oriented first layer on the single crystal fiber surface, a second feature of one form of the present invention is the deposition on the first layer of a particularly defined second layer. Upon deposition, the second layer is bonded with the first layer adequately to enable handling without coating removal during initial manufacturing steps such as spooling and winding. However, the second layer will desirably debond from the first layer upon exposure to thermal shock. As has been stated, such thermal shock can occur during low pressure plasma spraying of a metal matrix about the fibers to provide a preform, such as a sheet or ply, used in metal matrix composite manufacture. According to the present invention, such debonding is facilitated by the provision of a debonding interface between the first and second layers, defining a discontinuity zone in which debonding oocurs. In previous work reported for multiple layers of SiC deposited upon one another, emphasis has been Placed on avoiding such discontinuity between layers. The present invention requires this discontinuity zone.

The existence of a discontinuity zone between layers of the present invention allows the fiber to withstand thermal shock without damage as the second layer sacrificially, absorbs the stresses due to thermal shock by debonding from the first layer. One form of the present invention provides such a discontinuity interface by depositing of a second layer, such as of SiC, with a crystal structure different from that of the first layer. In addition a very thin silicon oxide phase separates the two layers. Conveniently the first and second layers are deposited in separate, distinct operations. However, as has been reported in the art, including the disclosures of some of the U.S. patents incorporated herein above, reactor conditions can be changed or adjusted within a single operation to achieve deposition of the first and second layers. Selection of conditions can provide the different crystal structures of the layers incorporated in the present invention. In one form of the present invention, the first layer of SiC on the single crystal fiber structure predominately is columnar and the second layer of SiC on the first layer is more granular and more equiaxed than the first layer structure. The two layers are separated by a very thin interface consisting of a silicon oxide phase.

During evaluation of the present invention, a reel of sapphire filament of 0.06" diameter was coated with multiple layers of SiC. The deposition was accomplished in separate operations in a reactor using a combination of methyltrichlorosilane (MTS) gas and hydrogen gas, using the well known chemical vapor deposition (CVD) method. The filament was passed continuously through the reactor and there was collected, after each coating step, on a take-up reel.

In this example, the first coating layer of Beta SiC on the filament lateral surface was deposited at a temperature of about 1150° C. at a pressure of 100 torr. The hydrogen-to-MTS ratio was about 10 to 1. Subsequent analysis of the first layer showed it to be substantially stoichiometric SiC with a crystal structure of predominantly columnar grains, disposed generally normal to the sapphire lateral surface.

The reel of SiC-coated sapphire filament was again passed through the reactor, but this second step to deposit the second SiC was conducted at a lower temperature than that used for the first coating deposition in order. In this second deposition, the temperature was maintained at about 1100° C., at a pressure of about 150 torr. The hydrogen-to-MTS ratio was about 2 to 1 in order to deposit a more silicon rich SiC layer, the ratio of silicon to carbon being about 1.16:1. which tended to have an equiaxed crystallographic structure. In this example, each of the coating layers was about 2 microns thick with the reaction bonding phase of $SiO_2$ of less than about 20 angstroms in thickness between the filament surface and the first coating layer.

The different conditions for deposition of the first and the second coating layers are interrelated and Particularly selected. A uniform and adherent first SiC coating was deposited using a temperature in the range of about 1000°–1200°C. Temperatures above about 1200°C. result in inconsistent adhesion of SiC to the sapphire fiber; at temperatures below about 1000° C., the deposition proceeds too slowly, all at a pressure of 100 Torr and a $H_2$:MTS ratio of about 10:1.

In order to deposit a uniform near-stoichiometric beta SiC first layer, about 2 microns thick, on the sapphire fiber, with little loss in fiber strength, the deposition must be done below about 1200° C. At about 1200° C. and above, an undesirable reaction occurs between MTS and $Al_2O_3$ in which $Al_2O_3$ is reduced by the chlorine in the MTS. A product of this reaction is $SiO_2$, which deposits at the interface and adversely affects the coating. Control of the reaction, that is the reduction of $Al_2O_3$ by chlorides, may be accomplished by the temperature limitations noted above, which appears to be critical to the success of the deposition process.

To successfully deposit the second layer of SiC over the first layer, in order to obtain a uniform second layer with acceptable adhesion, it is necessary to increase the $H_2$:MTS ratio to about 2:1, which increases the deposition rate at the lower temperature, about 1100° C. This slight excess of Si over C at this temperature is unexpected, because thermodynamic analysis indicates that there should be an excess of C over Si. It appears that the actual reaction kinetics limit the deposition of excess carbon, producing the unexpectedly good results of the second layer in the present invention.

The primary emphasis in the evaluation of the present invention has been with the use of SiC coating layers on Sapphire ($Al_2O_3$) fiber or filament. However, it will be recognized by those skilled in the art that the present invention defines a coating system for ceramic fibers or filaments in which a first coating layer is bonded tightly with the fiber surface and a second coating layer is disposed on the first layer across a debonding interface which defines a debonding discontinuity zone at which the second layer debonds from the first layer in the presence of thermal shock. It will be recognized that materials other than SiC can be used for such layers, for example TiC or other Ti-based material and similar types of materials and their mixtures, as referred to in some of the above- incorporated U.S. patents, such as U.S. Pat. No. 3,811,920, and elsewhere in the literature. Deposition processing conditions are selected for the particular materials used, to accomplish the goal of Providing the type of the above described, and interrelated coating layers. The scope of the present invention is intended to reside within the appended claims and their equivalents.

A monotape having a sapphire filament coated with two layers of SiC as described in the above example and identified as J533 was prepared using the process described in U.S. Pat. No. 4,786,566 for making state-of-the art silicon carbide monotape, except that sapphire filament of the present invention was substituted for the silicon carbide filament of U.S. Pat. No. 4,786,566, and such teaching is incorporated herein by reference. The nominal composition of the titanium alloy of the present invention was by weight, about 13% Al, about 24% Nb, about 2% V, balance Ti. The sprayed array, when cooled, was removed from the mandrel, cut into 0.4×4' plies and consolidated in a vacuum under high pressure; in a 1' Mo die at 1950° F. for 1 hour at 3000 pounds pressure. Metallographic analysis of the above consolidated article both in the transverse and longitudinal directions showed no coating or fiber damage or breakage in the consolidated panel.

The coated ceramic fiber system of the present invention shows improved mechanical properties when compared with the baseline sapphire fiber. In addition, approximately 95% of the coated fiber strength is retained after plasma spray. For example, the average strength after ten separate tests for run J533 showed the baseline sapphire $Al_2O_3$ fiber to have an average room temperature ultimate tensile strength (UTS) of 366 ksi whereas the coated fiber system prepared as in the above example had an average UTS of 473 ksi. Herein the term "ksi" means "thousands of pounds per square inch". This same improvement in strength occurs consistently with this and other runs as shown by the following table:

TABLE

STRENGTH DATA

| Example | UTS (ksi) |
| --- | --- |
| Spool 137 | 324 |
| Run J412 | 416 |
| Run J422 | 395 |
| Spool 227 | 366 |
| Run J511 | 433 |
| Run J518 | 467 |
| Run J533 | 473 |

Although the present invention has been described in connection with specific embodiments, they are intended to be typical of rather than limiting upon the scope of the invention. Those skilled in the art will readily recognize the various modification and variation of which this invention is capable.

I claim:

1. A coated ceramic fiber system for a composite structure in which the fiber system is subjected to an applied stress, comprising:
   a ceramic fiber core having an oriented structure including a lateral surface;
   a first coating layer of SiC tightly bonded about the lateral surface of the fiber, the layer having a first structure of predominantly columnar grains disposed substantially normal to the fiber lateral surface; and
   a second coating layer of SiC of a second structure different from the first structure of the first coating layer and disposed about the first layer wherein a debonding interface layer of an oxide of silicon is formed there between;
   the difference between the first and second structures at the interface defining a debonding discontinuity zone having a sufficiently weak bond to result in separation of the first and second coating layers at the debonding zone as a result of applied stress to the second coating layer.

2. The system of claim 1 in which the first coating layer is of a material which will react with the fiber lateral surface to provide a reaction bonding phase at the interface between the core and the first coating layer.

3. The system of claim 1 in which:
   the second structure of the second SiC coating layer includes grains which are more equiaxed than the first structure.

4. The system of claim 3 in which the ceramic fiber core has a single crystal structure.

5. The coated ceramic fiber system of claim 1 further including a reaction bonding phase of an oxide of silicon formed at the interface between the fiber and the first layer.

6. The coated ceramic fiber system of claim 5 wherein the ceramic fiber core is single crystal alumina.

* * * * *